(12) United States Patent
Sobchak et al.

(10) Patent No.: US 7,760,816 B2
(45) Date of Patent: Jul. 20, 2010

(54) AUTOMATIC GAIN CONTROL USING MULTIPLE EQUALIZED ESTIMATES DYNAMIC HYSTERESIS

(75) Inventors: Charles LeRoy Sobchak, Davie, FL (US); Mahibur Rahman, Lake Worth, FL (US); Lynn R. Freytag, Deerfield Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 757 days.

(21) Appl. No.: 11/622,402

(22) Filed: Jan. 11, 2007

(65) Prior Publication Data

US 2008/0170646 A1    Jul. 17, 2008

(51) Int. Cl.
*H04K 1/02* (2006.01)
*H04L 27/06* (2006.01)
*H04B 1/06* (2006.01)
*H04B 7/00* (2006.01)

(52) U.S. Cl. ............... 375/297; 375/345; 330/278; 330/295; 455/234.1; 455/253.2

(58) Field of Classification Search ............ 330/278, 330/295; 375/297, 345; 455/234.1, 253.2
See application file for complete search history.

(56) References Cited

U.S. PATENT DOCUMENTS

| | | | | |
|---|---|---|---|---|
| 5,257,286 A * | 10/1993 | Ray | ............... | 375/230 |
| 6,426,983 B1 * | 7/2002 | Rakib et al. | ............... | 375/346 |
| 7,113,758 B2 * | 9/2006 | Kishi | ............... | 455/234.1 |
| 7,116,955 B2 | 10/2006 | Schaffer et al. | | |
| 7,446,878 B2 * | 11/2008 | Ridder et al. | ............... | 356/451 |
| 7,522,658 B2 * | 4/2009 | Jensen | ............... | 375/219 |
| 2001/0019584 A1 * | 9/2001 | Azazzi et al. | ............... | 375/233 |
| 2004/0088343 A1 | 5/2004 | Cannon | ............... | 708/306 |
| 2004/0185810 A1 | 9/2004 | Kishi | ............... | 455/127.2 |
| 2004/0247042 A1 * | 12/2004 | Sahlman | ............... | 375/297 |
| 2005/0100105 A1 * | 5/2005 | Jensen | ............... | 375/259 |
| 2006/0019627 A1 | 1/2006 | Talbot | | |
| 2006/0034402 A1 * | 2/2006 | Azazzi et al. | ............... | 375/348 |
| 2006/0222116 A1 | 10/2006 | Hughes et al. | | |

OTHER PUBLICATIONS

U.S. Appl. No. 11/252,525, filed Oct. 18, 2005, Sobchak et al.
International Search Report for correlating PCT Patent Application No. PCT/US07/87688 dated May 13, 2008.

* cited by examiner

*Primary Examiner*—David C Payne
*Assistant Examiner*—Erin M File

(57) ABSTRACT

At least one adjustable gain analog amplifier (120, 124 and 128) in an analog line-up (102) amplifies by a gain an analog signal at an input of the analog line-up (102). The at least one adjustable gain analog amplifier (120, 124 and 128) is operable at one or more gains. At least one digital estimation device (134, 140 and 146) receives signal via an output (108) of the analog line-up (10) and provides a digital signal estimate representative of an analog signal at an input of a respective one of the at least one adjustable gain analog amplifier (120, 124 and 128) in the analog line-up (102). An AGC controller (152) monitors the digital signal estimate. The AGC controller (152) adjusts the gain of the at least one analog amplifier (120, 124 and 128). An RF receiver and an integrated circuit utilizing the novel features are also disclosed.

20 Claims, 6 Drawing Sheets

| THRESHOLDS | THRESHOLD NAME | GAIN STATE CHANGE |
|---|---|---|
| $rx\_agc\_th \begin{bmatrix} +d_{n-1}+hyst_n/2 \\ +d_{n-1} \\ +d_{n-1}-hyst_{n-1}/2 \end{bmatrix}$ | $state_{n-1}\_dec\_th$ <br><br> $state_{n-1}\_inc\_th$ | $(State_{n-1} \to State_n)$ <br><br> $(State_{n-1} \to State_{n-2})$ |
| $\vdots$ | $\vdots$ | $\vdots$ |
| $rx\_agc\_th \begin{bmatrix} +d_3+hyst_4/2 \\ +d_3 \\ +d_3-hyst_3/2 \end{bmatrix}$ | $state_3\_dec\_th$ <br><br> $state_3\_inc\_th$ | $(State_3 \to State_4)$ <br><br> $(State_3 \to State_2)$ |
| $rx\_agc\_th \begin{bmatrix} +d_2+hyst_3/2 \\ +d_2 \\ +d_2-hyst_2/2 \end{bmatrix}$ | $state_2\_dec\_th$ <br><br> $state_2\_inc\_th$ | $(State_2 \to State_3)$ <br><br> $(State_2 \to State_1)$ |
| $rx\_agc\_th \begin{bmatrix} +d_1+hyst_2/2 \\ +d_1 \\ +d_1-hyst_1/2 \end{bmatrix}$ | $state_1\_dec\_th$ <br><br> $state_1\_inc\_th$ | $(State_1 \to State_2)$ <br><br> $(State_1 \to State_0)$ |
| $rx\_agc\_th \begin{bmatrix} +d_0+hyst_1/2 \\ +d_0 \end{bmatrix}$ | $state_0\_dec\_th$ | $(State_0 \to State_1)$ |

AUTOMATIC GAIN CONTROL USING MULTIPLE EQUALIZED ESTIMATES DYNAMIC HYSTERESIS

BACKGROUND

1. Field

This invention relates generally to electronic devices using automatic gain control, and more specifically to analog circuits having cascaded controllable amplifying (gain) stages that are controlled with an automatic gain control system.

2. Related Art

In many applications of electronic circuits, a signal can benefit from signal conditioning such as by using an automatic gain control (AGC) system. In particular, for example, the presence of noise signals and other interference signals can deteriorate the quality of a desired signal. This is especially problematic in sensitive analog circuits having high amplification (or gain), such as found in analog receiver circuits. An AGC system is typically used to try to reduce the gain of unwanted signals while maintaining or increasing the gain of the desired signal.

A measure of a signal quality is sometimes stated as a Signal to Noise Ratio (SNR). Due to high amplification (gain) of desired signals in a particular electronic circuit design, such as by using a series of cascaded gain stages in a line-up, the high overall amplification also increases unwanted signals, e.g., noise and interference signals, to high levels. This overall gain increase can detrimentally affect the performance of the circuit, such as by causing clipping of desired signal at an output of the circuit. An AGC system can be used to adjust the overall gain of the amplification (or gain) stages to try to reduce the levels of unwanted signals while still maintaining or increasing the level of the desired signal. However, selectivity in an analog receiver circuit call create some problems for the AGC system as discussed below.

For receivers with high analog selectivity, AGC switch points can occur much earlier than necessary. These early switch points detrimentally impact the on-channel SNR regardless of whether noise or interference signals are present or whether noise or interference signals are strong enough to create clipping of desired signal.

Another receiver performance metric used, for example, for high-speed downlink packet access (HSDPA or 3.5G) transceivers is the receiver error vector magnitude (EVM) performance under both on-channel signal-only and interferer test cases. HSDPA transceivers require a receiver EVM of around 5% to achieve desired network throughput at signal levels of −60 dBm and higher. Receiver EVM performance is typically required to be 5% under on-channel signal-only test cases at antenna signal levels of −60 dBm and higher. Receiver EVM performance is typically required to be approximately 10% for adjacent channel interferer test cases.

To achieve this type of receiver EVM performance, an AGC in such receivers should maintain loop bandwidths of 1-kHz or less. Maintenance of such narrow bandwidths causes the receiver to be unable to quickly track out large gain errors introduced in the receiver whenever the AGC system alters gain settings. This inability leads to degraded receiver performance, such as under fading channel conditions. Running the AGC systems continuously in a medium or high bandwidth mode of operation significantly degrades receiver EVM performance to an unacceptably large degree of more than 15%.

Known receivers lack accurate power detectors at the various analog cascaded gain stages. This forces the AGC to sacrifice on-channel SNR and EVM performance by switching out gain earlier than necessary to prevent noise and interfering signals from compressing signal and/or creating IMD (Inter-modulation Distortion) products.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 7 is a gain state table for use by the AGC system of FIG. 6, showing increments and decrements in hysteresis thresholds used for determining gain states of cascaded controllable analog gain stages that are controlled by the AGC system.

DETAILED DESCRIPTION

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, a source code, an object code, and/or other sequence of instructions designed for execution on a computer system.

The present invention, according to an embodiment, overcomes problems with the prior art by accurately estimating the signal at every analog gain stage in an analog line-up and without using analog wideband detectors. In addition, digital equalizers provide accurate estimates of the signal present at each cascaded analog gain stage in a line-up to facilitate a method for a digital AGC to set optimal gain settings for the cascaded analog gain stages. This optimal gain setting method allows for all gain stages to be updated simultaneously. In addition, because the gain steps for each gain stage may not be all equal, one embodiment of the invention provides a dynamic method to set hysteresis and thresholds without complex programming and phasing requirements.

One embodiment of the present invention provides an RF receiver that benefits from optimized SNR performance regardless of whether noise and/or interference signals are present or not. This is a factor to be considered in modern data communication systems using high speed wireless protocols such as for high-speed downlink packet access (HSDPA or 3.5G) transceivers.

Figure 1:
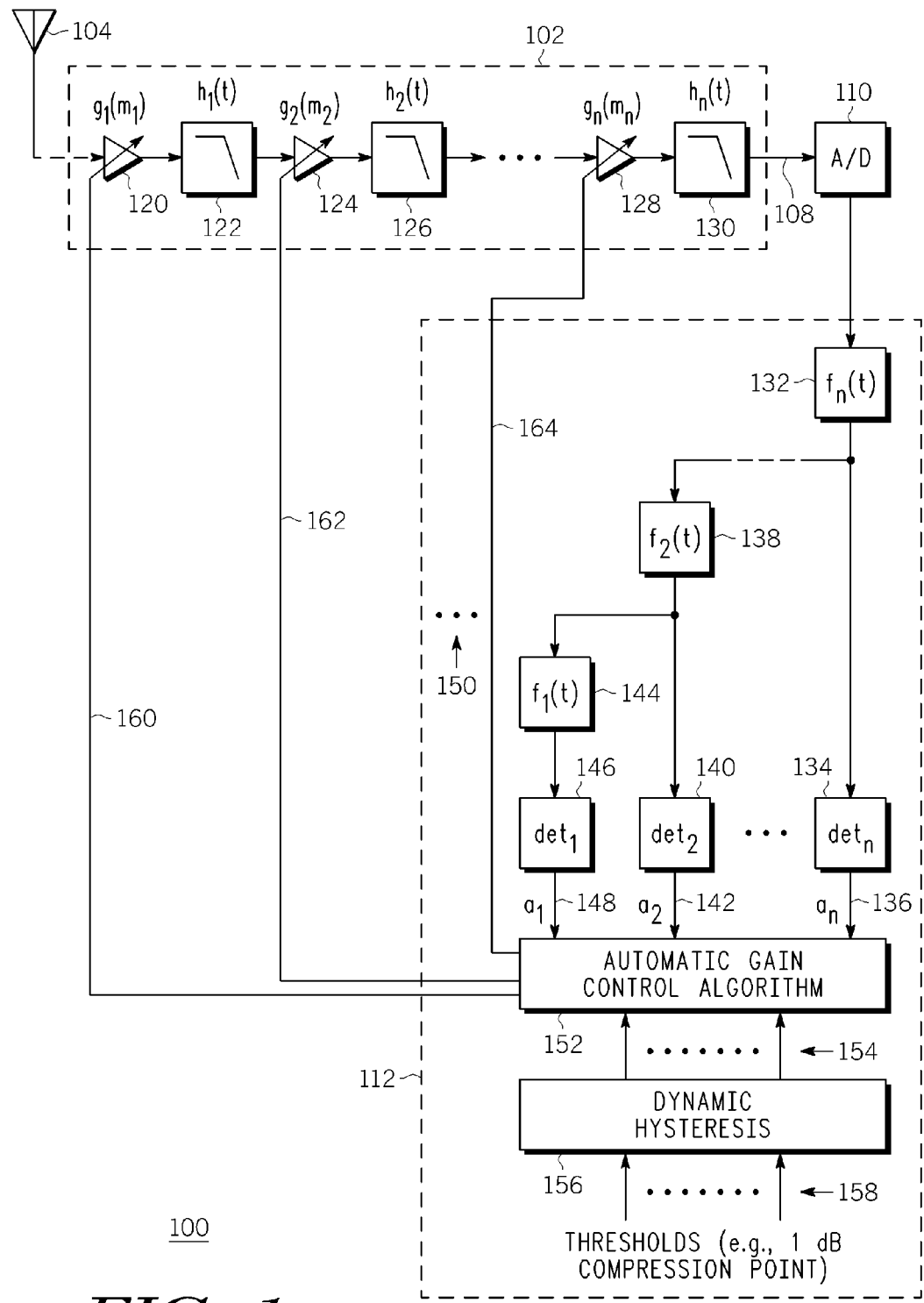
FIG. 1 is a simplified functional block diagram of a portion of a radio frequency receiver showing a series of cascaded controllable analog gain stages being controlled by an AGC system.

FIG. 1 is a simplified functional block diagram of a portion of a radio frequency (RF) receiver 100 with a series of cascaded controllable analog gain stages (in an analog line-up 102) being controlled by a digital AGC system 112. The RF receiver 100, in this example, is a zero-IF, or baseband, or direct conversion, receiver with a high dynamic range. However, it should become obvious to those of ordinary skill in the art in view of the present discussion that other types of receivers and other circuits could utilize an embodiment of the present invention. In one exemplary embodiment, the receiver 100 is a portion of a mobile, or wireless, telephone, or other wireless communication device (wireless device).

Starting at an antenna 104, a wirelessly received signal is coupled from the antenna 104 to a receiver analog line-up 102 that typically comprises an RF front-end section of the receiver 100 that includes an RF duplexer filter (not shown) and one or more low noise amplifiers (LNA) and filters that amplify and condition the received signal from the antenna 104. In this example, these LNA's and filters comprise controllable variable gain amplifier stages 120, 124 and 128, and respective associated filters 122, 126 and 130. The output 108 of the receiver analog line-up 102, according to one embodiment of the present invention, is coupled to an analog-to-digital (A/D) converter 110. The output of the A/D converter 110 provides a digital signal that represents an analog signal sampled by the A/D converter 110 at the output 108 of the receiver analog line-up 102.

The digital signal from the A/D converter 110 is coupled to a digital AGC system 112 that can thereby monitor the signal present at the output 108 of the receiver analog line-up 102, and also can monitor the output of each and every controllable variable gain amplifier stages 120, 124 and 128, and respective associated filters 122, 126 and 130, of the receiver analog line-up 102, as will be discussed in more detail below.

The digital AGC system 112 includes an nth digital equalizer filter $f_n(t)$ 132 matched to an nth analog filter 130 in the analog line-up 102. The nth digital equalizer filter $f_n(t)$ 132 receives an input digital signal, processes the digital signal, and provides an output digital signal that has been adjusted by substantially the inverse of the filter function of the nth analog filter 130. Thereby, the nth digital equalizer filter $f_n(t)$ 132 equalizes the digital signal to substantially cancel the effect of the nth analog filter 130. The resulting output digital signal would be representative of the analog signal at the input of the nth analog filter 130 in the analog line-up 102. This analog signal is also at the output of the nth variable gain stage 128 in the analog line-up 102.

There are many different methods to determine the response of a digital equalizer filter, i.e., the inverse response of an analog filter hn(t) over a desired bandwidth. One can create the filter by using a time domain Minimum Mean Square Error Estimation (MMSEE) method. This method creates a filter by minimizing the mean square error between the received signal and a test signal. One example of this type of method is a Recursive Least Squares (RLS) method which creates a filter using the following equation: $f_n = R^{-1} g(n)$, where R is an autocorrelation function and g(n) is a cross-correlation function. Alternatively, the response of a digital equalizer filter is done in the frequency domain as follows:

$$F_n(t) = [\text{IFFT}(H_n^{-1}(f) K_n(f)] / g_n(m_n)$$

In some applications, the equalizer filter function can be simplified by matching it only to the magnitude response of the corresponding analog filter without concern for group delay. This is so because, in these applications, a designer would only be interested in the power response over the equalized band and a designer would not care about the group delay. Note that IFFT stands for inverse finite Fourier transform. $K_n(f)$ represents a desired filter response within a bandwidth. $K_n(f)$ could be 1, or it could include, for example, an ideal low pass filter response at a bandwidth of interest. The frequency response of $K_n(f)$ can include a brick wall filter and/or a high pass notch filter to remove all unwanted frequencies that are not relevant for the estimate. $H_n^{-1}(f)$ represents 1 divided by the function of $H_n(f)$ which represents the inverse filter function in the frequency domain for the gain stage of interest. Based on the particular implementation, the compensation for the gain $g_n(m_n)$ of a particular gain stage can occur in the function of the digital equalizer filter $F_n(t)$, in the function of the digital estimation device $det_n$, or in any other place or component in the digital AGC system 112.

The digital AGC system 112 also includes an nth digital estimation device $det_n$ 134 corresponding to an output of the nth adjustable, or variable, gain stage 128 in the analog line-up 102. The nth digital estimation device $det_n$ 134 estimates, in one example of the digital AGC system 112, the output power at the output of the corresponding nth variable gain stage 128. The nth digital estimation device $det_n$ 134 estimates, in alternative examples of the digital AGC system 112, the peak power or the average power at the output of the corresponding nth variable gain stage 128. The nth digital estimation device $det_n$ 134 can include a digital estimator and also can include an averaging function. One method of creating a digital power estimate is to convert the input signal (i.e., the output of the filter fn) to a power (i.e., sum the square of the real and imaginary parts: $I^2 + Q^2$), then convert the power to a dB (i.e., take 10*log(power)) and then pass this through a low pass filter (or a simple integrator) to average the power estimate. Note that the nth digital estimation device $det_n$ 134 can be a power estimator or a peak estimator.

In similar fashion as discussed above, a second digital equalizer filter $f_2(t)$ 138 is matched to a second analog filter 126 in the analog line-up 102, and a first digital equalizer filter $f_1(t)$ 144 is matched to a first analog filter 122 in the analog line-up 102. The digital AGC system 112 also includes a second digital estimation device $det_2$ 140 corresponding to an output of the second variable gain stage 124 in the analog line-up 102, and a first digital estimation device $det_1$ 146 corresponding to an output of the first variable gain stage 120 in the analog line-up 102.

The respective outputs 136, 142, and 148, of the digital estimation devices $det_n$ 134, $det_2$ 140, and $det_1$ 146, are monitored by an AGC controller 152. The AGC controller 152 can be implemented as an AGC algorithm or process in a state machine, and/or in code executable by a processor, or in any other digital signal processing controller architecture as should be obvious to those of ordinary skill in the art in view of the present discussion. The AGC controller 152 will be discussed in more detail below with reference to FIG. 2. The AGC controller 152 utilizes one or more digital threshold values 154 to determine the gain states to set for the controllable variable gain amplifier stages 120, 124 and 128 in the analog line-up 102. In one embodiment, the one or more digital threshold values define one or more ranges of values that the AGC controller 152 can compare to a digital signal estimate to determine the gain state to set for at least one of the controllable variable gain amplifier stages 120, 124 and 128, which are operable at one gain of a plurality of gains.

In this example, the AGC controller 152 has a number of digital control outputs 150, several such outputs 160, 162 and 164, being shown, to digitally control the gain state of each and every one of the controllable variable gain amplifier stages 120, 124 and 128 in the analog line-up 102. Each of the controllable variable gain amplifier stages 120, 124 and 128, is operable at one gain of a plurality of gains. A digital value is provided from the AGC controller 152 to any one of the controllable variable gain amplifier stages 120, 124 and 128, to select a gain state for the particular controllable gain stage. Within a short time (e.g., typically in microseconds) of having the new state selected at its input, the particular controllable gain stage will adjust its gain to the new gain state. In this way, the digital AGC 112 controls the various gains of the various controllable gain amplifier stages 120, 124 and 128 in the analog line-up 102.

A dynamic hysteresis controller 156, in this example, uses a pre-defined set of input threshold values 158 to provide, as an input to the AGC controller 152, the one or more digital threshold values 154 used to determine the gain states to set for the controllable variable gain amplifier stages 120, 124 and 128 in the analog line-up 102. The dynamic hysteresis controller 156 will be discussed in more detail below.

To determine the upper and lower thresholds to use for a particular application one should consider the various gain states of each controllable gain analog amplifier stage. Also, because the gain step sizes can vary, one alternative embodiment of the invention utilizes a dynamic method for selecting hysteresis for setting thresholds for the various gain states of each controllable gain analog amplifier stage.

If a controllable gain analog amplifier stage has variable step sizes, one can either define a hysteresis for each step or one can use the following method to create a scaled version of the hysteresis that is a function of the minimum step size. This method significantly reduces the amount of hardware and software used in a hysteresis controller 156 to provide the thresholds to the AGC controller 152 because separate upper and lower hysteresis programmable registers for each non-uniform gain state in the analog lineup 102 are not needed. For each gain stage $g_n$:

stepsize$U_n$=($g_n(m-1)-g_n(m)$)

stepsize$L_n$=($g_n(m)-g_n(m+1)$)

upperhysteresis=(stepsize$U_n$−minstep$_n$)scale$_n$+minhysteresis$_n$ lowerhysteresis=(stepsize$L_n$−minstep$_n$)scale$_n$+minhysteresis$_n$ The above method can be extended to all m gain states, thus creating a precalculated table of upper and lower hysteresis using the following equations. (Note that the minhysteresis, upperhysteresis and lowerhysteresis are all two-sided hystereses. To have the actual upper and lower thresholds, upperhysteresis/2 and lowerhysteresis/2 are used.)

Upperhysteresis($m$)=(stepsize$U_{n(m)}$−minstep$_n$)scale$_n$+minhysteresis$_n$ Lowerhysteresis($m$)=(stepsize$L_{n(m)}$−minstep$_n$)scale$_n$+minhysteresis$_n$ where stepsize$U_n$(m) and stepsize$L_n$(m) indicate the upper and lower step size, respectively, for the $m^{th}$ gain state of gain stage $g_n$.

Figure 2:
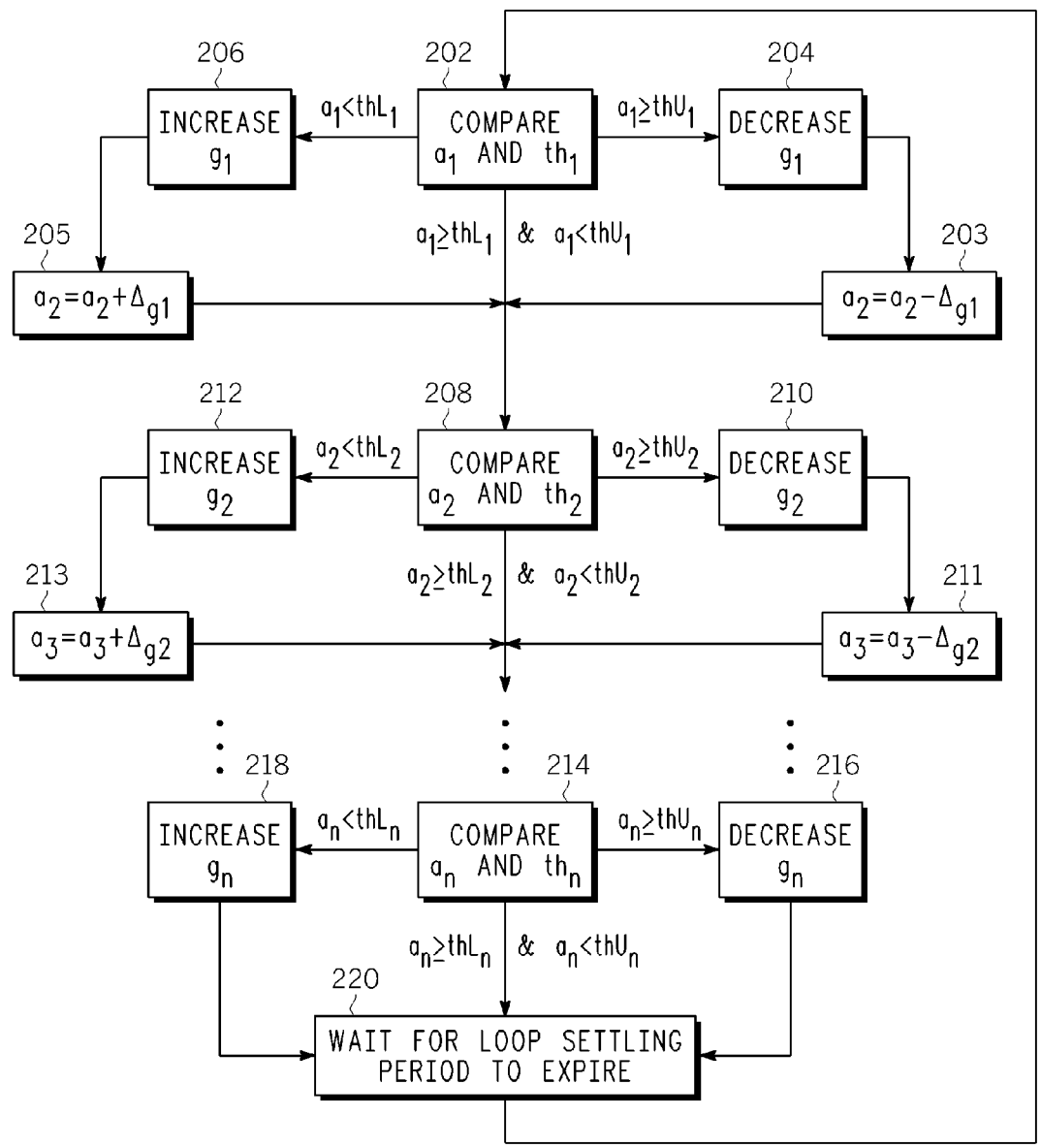
FIG. 2 is an operational flow diagram for a controller of the AGC system of FIG. 1, according to an exemplary embodiment of the invention.

FIG. 2 is an operational flow diagram for the AGC controller 152, according to an exemplary embodiment of the invention. With the digital signals at the respective outputs 136, 142 and 148 of the digital estimation devices det$_n$ 134, det$_2$ 140 and det$_1$ 146, the AGC controller 152 does a series of comparisons and calculations to arrive at a set of digital control outputs 150, several such outputs 160, 162 and 164 being shown in FIG. 1, to digitally control the gain state of each and every one of the controllable variable gain amplifier stages 120, 124 and 128 in the analog line-up 102.

In this example, the AGC controller 152, at step 202, compares the output of the first digital estimation device det$_1$ 146 to a predefined upper threshold and to a predefined lower threshold that define an operating range for the desired gain of the first variable gain stage 120 in the analog line-up 102. For example, these upper and lower thresholds could be set to maintain the output of the first variable gain stage 120 away from the 1-db compression points of the gain stage 120. The output of the first digital estimation device det$_1$ 146 represents an accurate estimate of the power of the analog signal at the output of the first variable gain stage 120 in the analog line-up 102. If the AGC controller 152, at step 202, determines that the digital signal at the output 148 of the first digital estimation device det$_1$ 146 is greater than or equal to the predefined upper threshold, then the AGC controller 152, at step 204, decreases the gain of the first variable gain stage 120. The AGC controller 152, at step 203, also decreases the digital estimate at the output 142 of the second digital estimation device det$_2$ 140 by the reduction of gain of the first variable gain stage 120. This immediate adjustment down of the digital estimate at the output 142 of the second digital estimation device det$_2$ 140 thereby immediately accounts at the next (second) gain stage 124 for the reduced gain being applied to the previous (first) gain stage 120. This quick adjustment being applied to the next (second) gain stage 124 (and in similar fashion to all of the subsequent gain stages) reduces the amount of delay for all adjustments of gain to take effect and reach a steady state gain at all of the gain stages 120, 124 and 128, in the analog line-up 102.

Alternatively, if the AGC controller 152, at step 202, determines that the digital estimate $a_1$ at the output 148 of the first digital estimation device det$_1$ 146 is less than the predefined lower threshold, then the AGC controller 152, at step 206, increases the gain of the first variable gain stage 120. The AGC controller 152, at step 205, also increases the digital estimate $a_2$ at the output 142 of the second digital estimation device det$_2$ 140 by an amount equal to the increase of gain of the first variable gain stage 120. This immediate adjustment up of the digital estimate $a_2$ at the output 142 of the second digital estimation device det$_2$ 140 thereby immediately accounts at the next (second) gain stage 124 for the increased gain being applied to the previous (first) gain stage 120. The adjustment in gain, in steps 203 and 205, can be a function based on the nonlinear effects of the amplifier $g_n$. The adjustment in gain, in steps 203 and 205, does not necessarily need to be the change in gain of the first variable gain stage 120 because, when the first variable gain stage is in strong compression, the gain is no longer linear. For simplicity, in this example, it is assumed that the gain is linear and thus use the change in gain is used to update the next estimate $a_{n+1}$.

If the AGC controller 152, at step 202, determines that the digital signal at the output 148 of the first digital estimation device det$_1$ 146 is not greater than or equal to the predefined upper threshold and also is not less than the predefined lower threshold, then the AGC controller 152, immediately proceeds to the next comparison step 208.

The AGC controller 152, at step 208, compares the output 142 of the second digital estimation device det$_2$ 140 to a predefined upper threshold and to a predefined lower threshold that define an operating range for the desired gain of the second variable gain stage 124 in the analog line-up 102. As discussed above, these upper and lower thresholds could be set, for example, to maintain the output of the second variable gain stage 124 away from the 1 db compression points of the gain stage 124. The output 142 of the second digital estimation device $det_2$ 140 represents an accurate estimate of the power of the analog signal at the output of the second variable gain stage 124 in the analog line-up 102. If the AGC controller 152, at step 208, determines that the digital signal at the output 142 of the second digital estimation device $det_2$ 140 is greater than or equal to the predefined upper threshold, then the AGC controller 152, at step 210, decreases the gain of the second variable gain stage 124. In similar fashions as has already been discussed above, the AGC controller 152, at step 211, also decreases the digital estimate at the output of the next digital estimation device by the reduction of gain of the second variable gain stage 124. This immediate adjustment down of the digital estimate at the output of the next digital estimation device thereby immediately accounts at the next gain stage for the reduced gain being applied to the previous (second) gain stage 124. This quick adjustment being applied to the next gain stage (and in similar fashion to all of the subsequent gain stages up to the final gain stage n 128) reduces the amount of delay for all adjustments of gain to take effect and reach steady state at all of the gain stages 120, 124 and 128, in the analog line-up 102.

Continuing with the operational flow sequence, if the AGC controller 152, at step 208, determines that the digital signal at the output 142 of the second digital estimation device $det_2$ 140 is less than the predefined lower threshold, then the AGC controller 152, at step 212, increases the gain of the second variable gain stage 124. The AGC controller 152, at step 213, also increases the digital estimate at the output of the next digital estimation device by the increase of gain of the second variable gain stage 124. Similar to as has been discussed above, this immediate adjustment up of the digital estimate at the output of the next digital estimation device thereby immediately accounts at the next gain stage for the increased gain being applied to the previous (second) gain stage 124.

If the AGC controller 152, at step 208, determines that the digital signal at the output 142 of the second digital estimation device $det_2$ 140 is not greater than or equal to the predefined upper threshold and also is not less than or equal to the predefined lower threshold, then the AGC controller 152, immediately proceeds to the next comparison step.

The AGC controller 152 continues with this operational flow sequence comparing digital estimates to predefined upper and lower thresholds for the remaining outputs of the digital estimation devices, and possibly adjusting gain for respective controllable gain stages in the analog line-up 102, until the output 136 of the nth digital estimation device $det_n$ 134 is compared to predefined upper and lower thresholds and the gain of the nth variable gain stage 128 is possibly adjusted, at steps 214, 216 and 218.

After the AGC controller 152 does all of the series of comparisons and calculations to arrive at a set of digital control outputs 150, several such outputs 160, 162 and 164, being shown in FIG. 1, to digitally control the gain state of each and every one of the controllable variable gain amplifier stages 120, 124 and 128, in the analog line-up 102, the AGC controller 152, at step 220, waits for a delay time interval to allow the digital control outputs to be applied to, and to settle to a steady state at, all of the controllable variable gain amplifier stages 120, 124 and 128. The control loop, after the delay, repeats the process described above.

This continuous and autonomous process, as has been described above, allows real time monitoring and gain adjustment for each and every output of the controllable gain stages 120, 124 and 128, in the analog line-up 102. The digital AGC system 112 uses multiple equalized estimates with dynamic hysteresis that allow for more optimal gain settings in the analog line-up 102 and improved SNR because the signal power is estimated at each gain stage. This innovative wireless receiver 100 benefits from the novel digital AGC system 112 controlling the analog line-up 102 to maximize SNR (Signal to Noise Ratio) and EVM (Error Vector Magnitude) performance of the wireless receiver 100 with one or more cascaded analog filtering stages 120, 124 and 128. This applies to both on-channel and interference scenarios for a wireless receiver 100. Such an implementation can achieve >10-dB SNR and <10% EVM performance for high speed wireless communications such under the HSDPA (3.5G) protocol under all adjacent channel interference test cases.

Figure 3:
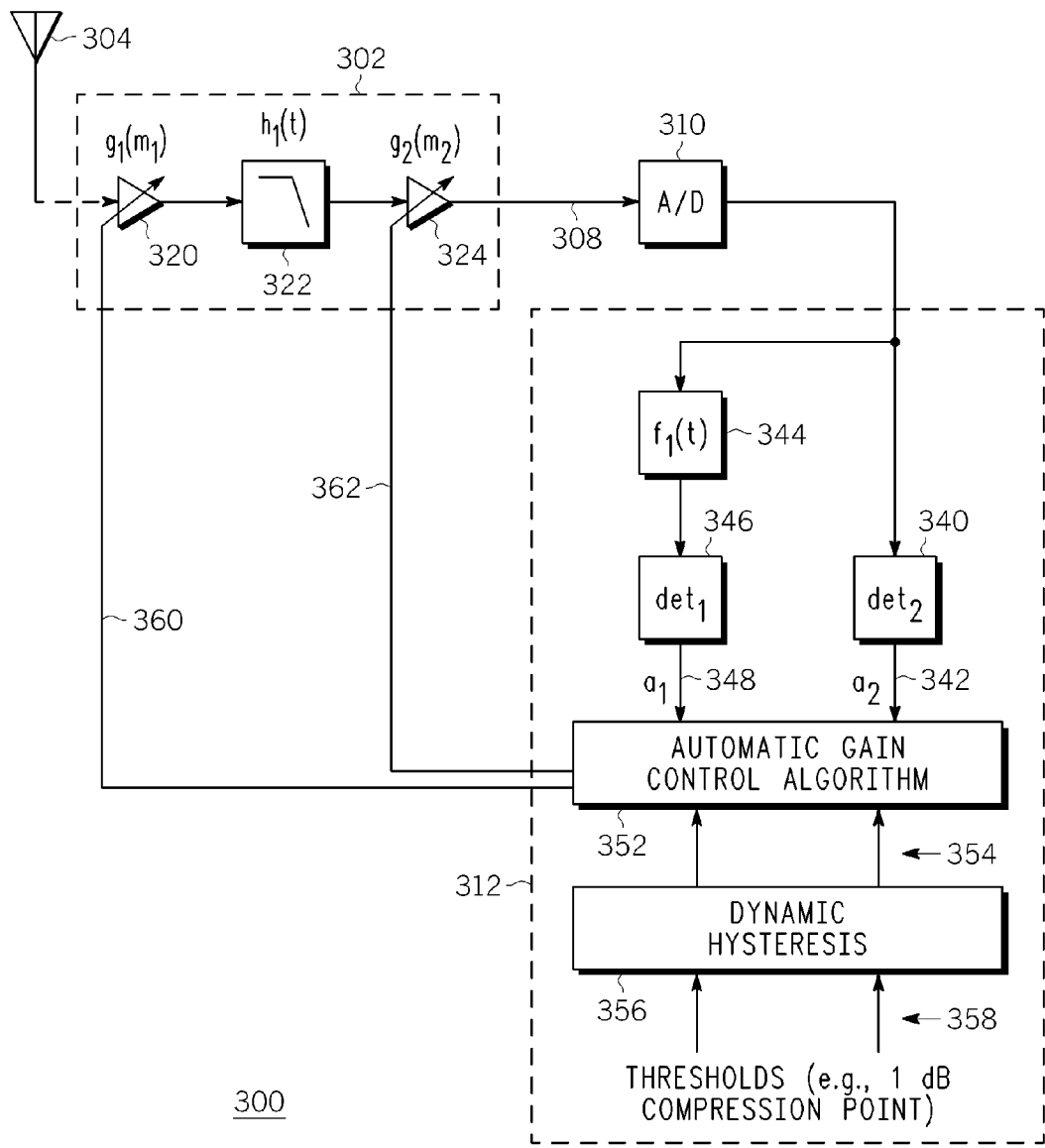
FIG. 3 simplified functional block diagram of a portion of a radio frequency receiver showing two cascaded analog gain stages arranged in a three-pole analog low-pass filter circuit being controlled by an AGC system.

FIG. 3 illustrates a simplified example of a portion of an RF receiver 300 and the operation of a digital AGC, according to an alternative embodiment of the invention. With reference to FIG. 3, an RF receiver 300 includes an antenna 304 coupled to an analog line-up 302 that comprises two cascaded controllable analog gain stages 320 and 324, and a three-pole analog low-pass filter 322. The controllable analog gain stages 320 and 324, are controlled by a digital AGC system 312.

Similar to the previous discussion with reference to FIG. 1, the digital AGC system 312 includes control outputs 360 and 362, to control respective first and second controllable analog gain stages 320 and 324, in the analog line-up 302. An AGC controller 352 monitors two digital estimates provided at two outputs 348 and 342, of two digital estimation devices $det_1$ 346 and $det_2$ 340. These two digital estimates correspond to the analog signals present at the output of the first controllable analog gain stage 320 and at the output 308 of the second controllable analog gain stage 324 (which is also the output 308 of the analog line-up 302).

Figure 4:
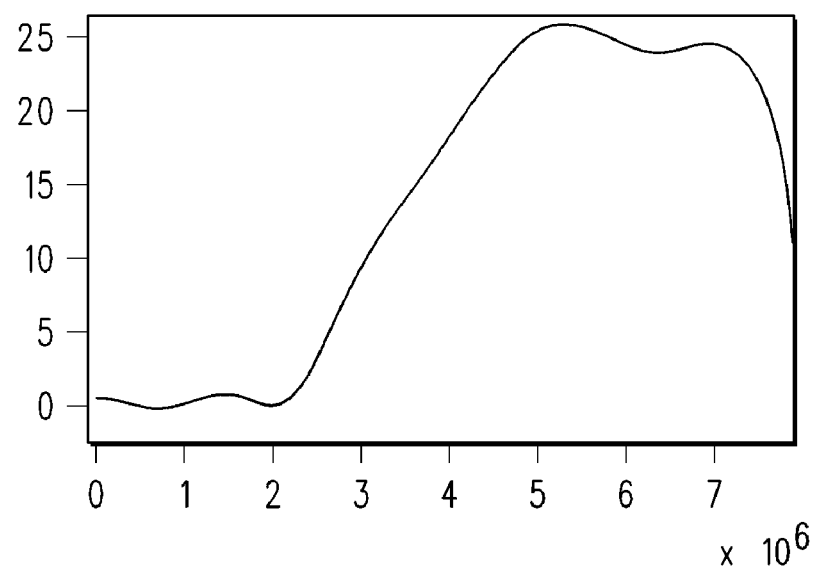
FIG. 4 is a graph showing a signal response for an equalization filter corresponding to an inverse of a three-pole analog low-pass filter.
Figure 5:
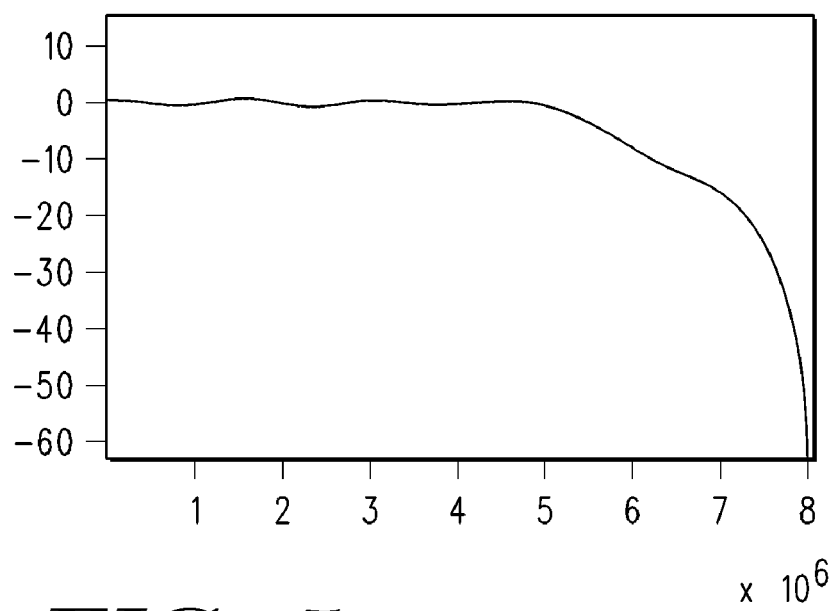
FIG. 5 is a graph showing a signal response at the output of the equalization filter of FIG. 4 as used in the example of FIG. 3.

The digital AGC system 312 includes a digital equalizer filter $f_1(t)$ 344 matched to the first (and only) analog filter 322 in the analog line-up 302. The analog filter 322 comprises a three-pole analog low-pass filter. Accordingly, the digital equalizer filter $f_1(t)$ 344 provides a frequency response function that is substantially the inverse of the three-pole analog low-pass filter 322 in the analog line-up 302. Such inverse function of the digital equalizer filter $f_1(t)$ 344 is shown in FIG. 4. FIG. 5 shows the equalized output of the digital equalizer filter $f_1(t)$ 344. FIG. 5 illustrates, in an actual test implementation, how a function of the digital equalizer filter $f_1(t)$ 344, when applied to a digital signal representative of the analog signal at the output of the analog low-pass filter 322 substantially canceled the effect of the analog filter 322. FIG. 5 shows the result of $h_1(t)*f_1(t)$. As can be seen, the response has been accurately equalized, in this test case, out to approximately 5 MHz. That is, the resulting output digital signal at the output of digital equalizer filter $f_1(t)$ 344 would be representative of the analog signal at the input of the analog filter 322 in the analog line-up 302.

More specifically, the digital AGC system 312 includes the digital equalizer filter $f_1(t)$ 344 that is matched to the analog filter 322 in the analog line-up 302. The digital equalizer filter $f_1(t)$ 344 receives a digital signal from the A/D converter 310, processes the digital signal, and provides an output digital signal that has been adjusted by substantially the inverse of the filter function of the analog filter 322. Thereby, the digital equalizer filter $f_1(t)$ 344 equalizes the digital signal to substantially cancel the effect of the analog filter 322. The resulting output digital signal would be representative of the analog signal at the input of the analog filter 322 in the analog line-up 302. This analog signal is also at the output of the first controllable analog gain stage 320 in the analog line-up 302.

By utilizing the digital equalizer filter $f_1(t)$ 344 matched to the analog filter 322, the AGC controller 352 monitors the two digital estimates provided at the two outputs 348 and 342 of the two digital estimation devices $det_1$ 346 and $det_2$ 340, where these two digital estimates represent the analog signals present at the outputs 320 and 308 of the first controllable analog gain stage 320 and the second controllable analog gain stage 324. The AGC controller 352 utilizes the input threshold values 354 to make comparisons and possibly to increase or decrease the gain state of each of the first and second controllable analog gain stages 320 and 324 in the analog line-up 302. This comparison and possible gain adjustment process followed by the AGC controller 352 is similar to the discussion above of such a process with reference to FIG. 2, and for brevity will not be repeated again.

Additionally, the dynamic hysteresis controller 356, in this example, uses a pre-defined set of input threshold values 358 to provide, as an input to the AGC controller 352, the one or more digital threshold values 354 used to determine the gain states to set for the controllable variable gain amplifier stages 320 and 324 in the analog line-up 302. Methods useful for a hysteresis threshold setting process for the dynamic hysteresis controller 356 have been discussed above with reference to the dynamic hysteresis controller 156 of FIG. 1, and for brevity will not be repeated again here.

It should be clear in view of the specific example discussed immediately above, and further in view of the more generic example discussed further above with reference to FIGS. 1 and 2, that the novel wireless receiver 100 and 300 in accordance with two alternative embodiments of the invention discussed above, can benefit from the novel digital AGC system 112 and 312 controlling an analog line-up 102 and 302 to maximize SNR and EVM performance of the wireless receiver 100 and 300. This applies to both on-channel and interference scenarios for a wireless receiver 100 and 300. Such an implementation can achieve >10 dB SNR and <10% EVM performance for high speed wireless communications such under the HSDPA (3.5G) protocol under all adjacent channel interference test cases. This is a significant advantage of the exemplary embodiments of the invention discussed above, and which has not been available in the past.

Figure 6:
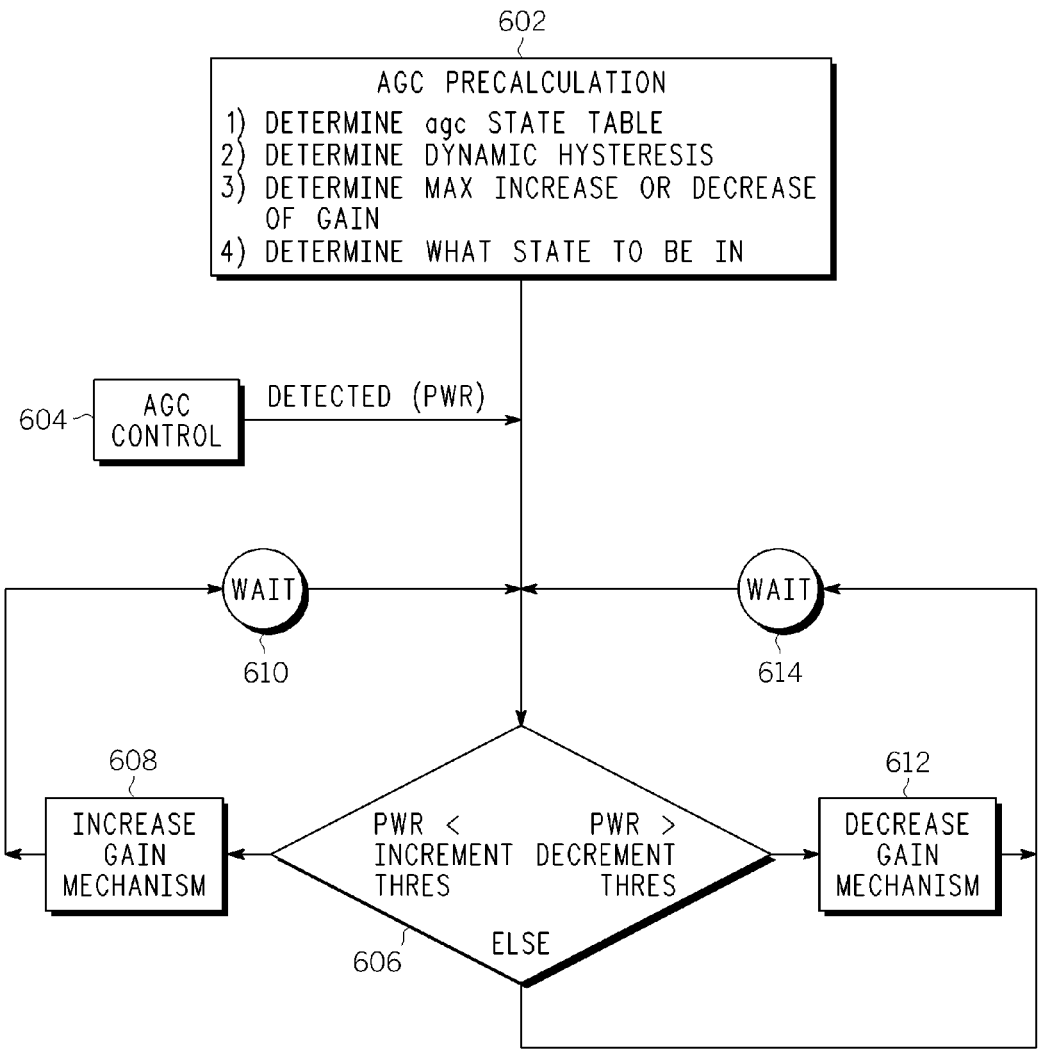
FIG. 6 is a flow diagram for an AGC system that controls a series of cascaded controllable analog gain stages, according to an alternative embodiment of the invention.

FIG. 6 is a flow diagram 600 for an AGC system, similar to that discussed above with reference to FIGS. 1 and 2, that controls a series of cascaded controllable analog gain stages, according to an alternative embodiment of the invention.

Issues being addressed by this embodiment of the invention include the following: 1) Computing thresholds for the control of multiple gain stages when the gain stages have variable step size, thus allowing for nonlinear (non-monotonic) gain stages. 2) Incorporating scalable hysteresis at each threshold point (can be scaled in proportion to the individual step size). 3) Having control over the number and order of the steps being executed for each gain stage.

This embodiment of the invention allows multiple gain stages to work together to regulate the gain in a closed-loop AGC system. When controlling multiple variable gain stages, where each stage contains gain steps of varying size, it would be desirable to be able to limit the number of thresholds that have to be initialized, and allow the system to self-generate individual thresholds at spacings proportional to the non-monotonic step sizes. These thresholds would generate a lookup table against which the incoming detected power would be compared in order to determine the direction and magnitude of gain update in each stage.

FIG. 7 is a gain state table 700 for use by the digital AGC system 112. Features of such an implementation include the following: 1) The gain steps within each stage are combined together to form one state table 700 containing gain stages at varying deltas. 2) The user can program the individual gains corresponding to each gain step. 3) The user can rank the states in the state table 700 such that none, some, or all of one gain stage's steps can be traversed before beginning to update the other stages. For an increasing input signal, this allows a user or system designer to specify which gain stage should decrement first (for optimal SNR) and for how long, before starting to decrement other stages. 4) Each state in the state table 700 is represented by one or both of an increment and decrement threshold to be applied to the incoming detected power. The state table 700 is created by concatenating the steps for each stage, in the order specified by the user in (3) above, so that the increment and decrement thresholds represent the combination of the stages. 5) Because each state has its own set of gains and increment/decrement steps, the user need only program three items: an initial threshold, a number of steps of one stage to traverse before the other gain stages start changing, and a total number of steps to use for the other gain stages. These features allow for great freedom in organizing the gain structure of the digital AGC system 112 and 312. The flow diagram in FIG. 6 shows one example of a basic mode of operation.

In the embodiment shown in FIG. 3, there are two gain stages, Stage A 320 and Stage B 324. With reference to FIGS. 3, 6 and 7, block 602 computes the individual thresholds in the state table 700 given in FIG. 7 as well as the dynamic hysteresis to be applied to each threshold, thus producing the set of thresholds 354 to be fed into block 352. Block 352 may contain logic to select between the detected power values $a_1$ 348 and $a_2$ 342 in order to choose one value to compare to the thresholds 354. Then, during each update cycle, step 604 computes the estimated detected power ($a_1$ 348 or $a_2$ 342) to be fed to the AGC controller block 352. At step 606, block 352 compares the estimated detected power value computed by step 604 against each threshold computed by step 602 (details of step 602 are shown in FIG. 7) to see where the detected power falls on the state table 700. If the detected power ($a_1$ 348 or $a_2$ 342) is less than a given threshold, at step 606, then the gain is increased, at step 608, and the digital AGC system 312 waits for the next update cycle, at step 610. Alternatively, if the detected power ($a_1$ 348 or $a_2$ 342) is greater than a given threshold, at step 606, then the gain is decreased, at step 612, and the digital AGC system 312 waits for the next update cycle, at step 614. If the detected power ($a_1$ 348 or $a_2$ 342) is not less than a given threshold and the detected power ($a_1$ 348 or $a_2$ 342) is not greater than a given threshold, at step 606, then the digital AGC system 312 does nothing, and waits for the next update cycle, at step 614. Additional logic (not shown) inside block 352 determines whether Stage A 320 or Stage B 324 will receive the updates, based on the user's selection of how many states in Stage A should occur first and the total number of states to use for Stage B.

A depiction of an example increment and decrement series, for use with the flow diagram 600 of FIG. 6, is given in the state table 700 shown in FIG. 7. State 0 is considered to be the maximum gain state, and the state transitions corresponding to the decrement thresholds are decreases in gain below max gain. Conversely, the increment threshold series represents increases in gain back to State 0. Delta values $d_n - d_{(n-1)}$ correspond to the gain differences between two adjacent states of a given gain block. In one implementation, a Pre-calculation Finite State Machine (FSM) block may compute these deltas and use them, along with a programmable scalable hysteresis, to adjust a baseline programmable threshold to produce the increment and decrement thresholds for the comparators.

In general, $$state_n\_dec\_thresh = agc\_thresh + d_n + hyst_{(n+1)}/2$$

$$state_{(n+1)}\_inc\_thresh = agc\_thresh + d_{(n+1)} - hyst_{(n+1)}/2,$$

where:

$state_n\_dec\_thresh$ = the threshold for increasing input power for $State_n$, beyond which the gain in that stage should decrease from $State_n$ to $State_{(n+1)}$.

$state_n\_inc\_thresh$ = the threshold for decreasing input power for $State_n$, beyond which the gain in that stage should increase from $State_n$ to $State_{(n-1)}$.

$agc\_thresh$ = the programmable threshold that is used to compute the individual thresholds in the concatenation of the steps from all the gain stages.

$d_n$ = a running cumulative total of the individual deltas representing the total gain change between $State_n$ and $State_0$ (thus, $d_0=0$). Depending upon the user's selection of the number of states in Stage A to occur first, $d_1$ would equal $(d_0+(gain_0(Stage_A)-gain_1(Stage_A))$, if Stage A decrements first, or $(d_0+(gain_0(Stage_B)-gain_1(Stage_B))$ if Stage B decrements first. The value of $d_2$ then equals the sum of $d_1$ plus the next delta.

$hyst_n$ = the hysteresis for state transitions between n and (n−1).

An example is given below:

$$state_0\_dec\_thresh = agc\_thresh + d_0 + hyst_1/2$$

$$state_1\_inc\_thresh = agc\_thresh + d_1 - hyst_1/2$$

$$state_1\_dec\_thresh = agc\_thresh + d_1 + hyst_2/2.$$

In the exemplary implementation shown in FIG. 3, Stage A 320 has a fixed number (e.g., 8) of gain states with fixed but unequal gain values; thus, 7 deltas are available. For Stage B 324, the user may select a variable number of states with programmable gain values to use in computing deltas (e.g., from 2 to 7 total states), so anywhere from 1 to 6 deltas could be used. For this example, this results in a total number of 7+6=13 deltas. For Stage A 320, the user can decide to have anywhere from 0 states first (i.e., all the states in Stage B 324 occur first before Stage A starts updating) to all the Stage A states first. The states in Stage B 324 occur together in series and are not broken up. The number of Stage B 324 gain deltas that can be used in the $d_n$ equations depends upon the user's choice of the total number of states to use for Stage B. The point at which Stage A 320 gain deltas begin being included in the running total is determined by the user's selection of the number of states in Stage A to occur first. Once the total number of Stage A 320 and Stage B 324 states are used up, further delta values are undefined and are not used.

In the exemplary embodiments discussed above, the entire portion of the wireless receiver 100 and 300, including the analog line-up 102 and 302, and the digital AGC system 112 and 312, circuitry is implemented and disposed on a circuit-supporting substrate supporting the above mentioned circuits. An example of such a circuit-supporting substrate implementing the entire portion of the wireless receiver 100 and 300 is a single integrated circuit that is manufactured using complementary metal oxide semiconductor (CMOS) technology. However, it should be obvious to those of ordinary skill in the art in view of the present discussion that other circuit manufacturing technologies, or combination of technologies, can be used to implement alternative embodiments of the invention. In the exemplary embodiments, the operating frequency range of the wireless, or RF, receiver 100 and 300 is approximately 800-2000 MHz.

It should be understood that all circuitry described herein may be implemented either in silicon or another semiconductor material or alternatively by software code representation of silicon or another semiconductor material.

While the principles of the invention have been described above in connection with specific apparatus, it is to be clearly understood that this description is made only by way of example and not as a limitation on the scope of the invention. For instance, although the exemplary embodiment is for use with a zero IF receiver, the exemplary embodiment can also be used with a very low IF receiver, a low IF receiver or with any receiver. Additionally, the novel aspects of the digital AGC system can be applied to devices and circuits other than receiver circuits, as should be obvious to those of ordinary skill in the art in view of the present discussion.

Although the exemplary embodiment is shown on a single integrated circuit manufactured using CMOS technology, the invention can also be used on a single integrated circuit manufactured using other manufacturing technologies. Although the exemplary embodiment is shown on a single integrated circuit the invention, is equally applicable when portions of the embodiment are on more than one integrated circuit. Although the exemplary embodiment is shown on an integrated circuit, the invention is equally applicable when the embodiment is on a circuit in a form other than an integrated circuit.

Accordingly, the specification and figures are to be regarded in an illustrative rather than in a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A radio frequency (RF) receiver, comprising:
   a plurality of analog filters in an RF front-end section of an RF receiver;
   a plurality of adjustable-gain analog amplifiers in the RF front-end section for amplifying by a gain a signal received by the RF receiver, each adjustable-gain analog amplifier operable at one gain separately selected from a plurality of gains, the RF front-end section producing an analog signal at an analog output;
   a digital-to-analog converter, coupled to the analog output, for converting the analog signal to a digital signal at a digital output; and
   a digital automatic gain control (AGC) system, communicatively coupled with the plurality of adjustable-gain analog amplifiers, for controlling the one gain of each adjustable-gain analog amplifier, the digital AGC system including:
   a plurality of digital equalizer filters, one of the digital equalizer filters communicatively coupled with the digital output of the RF front-end section, thereby monitoring a digital signal estimate of the analog signal at the analog output of the RF front-end section, each digital equalizer filter having an inverse magnitude response of a corresponding analog filter in the RF front-end section;

a plurality of digital estimation devices, each digital estimation device coupled to one of the digital equalizer filters, each digital estimation device providing a digital signal estimate representative of an analog signal at an input of a respective one of the adjustable-gain analog amplifiers in the RF front-end section; and an AGC controller, communicatively coupled with each digital estimation device, for monitoring the digital signal estimate provided by each digital estimation device, thereby monitoring a level of the analog signal at the input of the respective one of the adjustable-gain analog amplifiers in the RF front-end section, the AGC controller having a control output communicatively coupled with a respective control input of each adjustable-gain analog amplifier for separately controlling the one gain of each respective adjustable-gain analog amplifier based, in part, on the digital signal estimate provided by each digital estimation device.

2. The RF receiver of claim 1, wherein the AGC controller compares a digital signal estimate from the plurality of one digital estimation device to one or more digital threshold values to determine a gain state to set for each adjustable-gain analog amplifier.

3. The RF receiver of claim 2, wherein the one or more digital threshold values correspond to one or more gain states of the at least one adjustable-gain analog amplifier.

4. The RF receiver of claim 3, wherein the one or more digital threshold values define one or more ranges of values that the AGC controller compares to the digital signal estimate to determine the gain state to set for the at least one adjustable-gain analog amplifier.

5. The RF receiver of claim 2, wherein the AGC controller compares a plurality of digital signal estimates from the plurality of digital estimation devices to one or more digital threshold values to determine the gain state to set for the plurality of adjustable-gain analog amplifiers.

6. The RF receiver of claim 1, wherein each digital equalizer filter has an inverse magnitude response for all frequencies present in the digital signal at the digital output.

7. The RF receiver of claim 1, including a gain state table, and wherein each digital equalizer filter has its own set of gains and increment/decrement steps, separate from the other digital equalizer filters, stored in the gain state table, for use by the digital AGC system.

8. The RF receiver of claim 1, including a dynamic hysteresis controller that uses a pre-defined set of hysteresis threshold values to provide, as an input to the AGC controller, digital hysteresis threshold values used for setting gain states for the plurality of adjustable-gain analog amplifiers in the RF front-end section.

9. The RF receiver of claim 8, wherein the one or more hysteresis threshold values are pre-defined according to at least one of the following relationships:

an upper hysteresis threshold value for a step is equal to (upper step size threshold minus a minimum step value) multiplied by a scaling factor plus a minimum hysteresis value; and a lower hysteresis threshold value for the same step is equal to (lower step size threshold minus a minimum step value) multiplied by a scaling factor plus a minimum hysteresis value.

10. The RF receiver of claim 1, wherein the plurality of adjustable-gain analog amplifiers in the RF front-end section has steps of nonlinear sizes for the plurality of gains at which each adjustable-gain analog amplifier is operable, and wherein the digital AGC system includes a dynamic hysteresis controller that computes thresholds for the steps of nonlinear sizes.

11. The RF receiver of claim 1, wherein the plurality of gains at which each adjustable-gain analog amplifier is operable has steps of nonlinear sizes, and wherein a scaled version of the hysteresis at each threshold point is a function of minimum step size, as follows:

for each gain stage:

$$\text{stepsize}U_n = g_n(m-1) - g_n(m)$$

$$\text{stepsize}L_n = g_n(m) - g_n(m+1)$$

$$\text{upperhysteresis} = (\text{stepsize}U_n - \text{minstep}_n)\text{scale}_n + \text{minhysteresis}_n$$

$$\text{lowerhysteresis} = (\text{stepsize}L_n - \text{minstep}_n)\text{scale}_n + \text{minhysteresis}_n,$$

where $g_n$ is the gain of the $n^{th}$ gain stage.

12. A method of automatic gain control for one or more cascaded adjustable-gain analog amplifiers, the method comprising:

providing one or more digitally equalized power estimates for one or more respective cascaded adjustable-gain analog amplifiers;

selecting a first digitally equalized power estimate from the one or more digitally equalized power estimates, the selected first digitally equalized power estimate being associated with a first adjustable-gain analog amplifier in the one or more cascaded adjustable-gain analog amplifiers;

determining whether to digitally adjust the selected first digitally equalized power estimate associated with the first adjustable-gain analog amplifier;

providing, responsive to the determining, a gain control signal to the first adjustable-gain analog amplifier corresponding to the selected first digitally equalized power estimate;

comparing the selected first digitally equalized power estimate to a first predefined digital threshold of power associated with the first adjustable-gain analog amplifier; and determining in the affirmative to digitally adjust the selected first digitally equalized power estimate associated with the first adjustable-gain analog amplifier if the comparing indicates that the selected first digitally equalized power estimate is greater than the first predefined digital threshold of power.

13. The method of claim 12, wherein the selected first digitally equalized power estimate is determined greater than the first predefined digital threshold of power when one of:

the selected first digitally equalized power estimate is above the first predefined digital threshold of power; and the selected first digitally equalized power estimate is below the first predefined digital threshold of power.

14. The method of claim 12, wherein the first adjustable-gain analog amplifier has one or more adjustment steps for adjusting the gain, and the method further comprising:

comparing the selected first digitally equalized power estimate to a first predefined digital threshold of power associated with the first adjustable-gain analog amplifier, wherein the first predefined digital threshold of power is set according to one or more hysteresis thresholds relative to the one or more adjustment steps; and determining in the affirmative to digitally adjust the selected first digitally equalized power estimate associated with the first adjustable-gain analog amplifier if the comparing indicates that the selected first digitally equalized power estimate is greater than the first predefined digital threshold of power.

15. The method of claim 14, wherein the one or more hysteresis thresholds relative to the one or more adjustment steps are pre-defined according to at least one of the following relationships:
an upper hysteresis threshold for a step is equal to (upper step size threshold minus a minimum step value) multiplied by a scaling factor plus a minimum hysteresis value; and
a lower hysteresis threshold for the same step is equal to (lower step size threshold minus a minimum step value) multiplied by a scaling factor plus a minimum hysteresis value.

16. The method of claim 12, further comprising:
in response to the determining, digitally adjusting the selected first digitally equalized power estimate associated with the first adjustable-gain analog amplifier to bring the selected first digitally equalized power estimate within a predefined power range.

17. The method of claim 12, further comprising:
selecting a second digitally equalized power estimate from the one or more digitally equalized power estimates, the selected second digitally equalized power estimate being associated with a second adjustable-gain analog amplifier in the one or more cascaded adjustable-gain analog amplifiers, the second adjustable-gain analog amplifier being part of a subsequent stage in the one or more cascaded adjustable-gain analog amplifiers;
determining whether to digitally adjust the selected second digitally equalized power estimate associated with the second adjustable-gain analog amplifier, based at least in part on the selected first digitally equalized power estimate being associated with the first adjustable-gain analog amplifier; and
providing, responsive to the determining whether to digitally adjust the selected second digitally equalized power estimate, a gain control signal to the second adjustable-gain analog amplifier corresponding to the selected second digitally equalized power estimate.

18. The method of claim 12, further comprising
comparing the selected first digitally equalized power estimate to a first predefined digital threshold of power associated with the first adjustable-gain analog amplifier;
determining whether to digitally adjust the selected first digitally equalized power estimate associated with the first adjustable-gain analog amplifier if the comparing indicates that the selected first digitally equalized power estimate is outside of a pre-defined power range associated with the first predefined digital threshold of power;
selecting a second digitally equalized power estimate from the one or more digitally equalized power estimates, the selected second digitally equalized power estimate being associated with a second adjustable-gain analog amplifier in the one or more cascaded adjustable-gain analog amplifiers, the second adjustable-gain analog amplifier being part of a subsequent stage in the one or more cascaded adjustable-gain analog amplifiers;
comparing the selected second digitally equalized power estimate, as first adjusted by any digital adjustment of the selected first digitally equalized power estimate, to a second predefined digital threshold of power associated with the second adjustable-gain analog amplifier;
determining whether to digitally adjust the selected second digitally equalized power estimate associated with the second adjustable-gain analog amplifier if the comparing indicates that the selected second digitally equalized power estimate, as first adjusted by any digital adjustment of the selected first digitally equalized power estimate, is outside of a pre-defined power range associated with the second predefined digital threshold of power; and
providing, responsive to the determining whether to digitally adjust the selected second digitally equalized power estimate, a gain control signal to the second adjustable-gain analog amplifier corresponding to the selected second digitally equalized power estimate.

19. The method of claim 12, wherein the plurality of gains at which each adjustable-gain analog amplifier is operable has steps of nonlinear sizes, and wherein a scaled version of the hysteresis at each threshold point is a function of minimum step size, as follows:
for each gain stage:

$$\text{stepsize}U_n = g_n(m-1) - g_n(m)$$

$$\text{stepsize}L_n = g_n(m) - g_n(m+1)$$

$$\text{upperhysteresis} = (\text{stepsize}U_n - \text{minstep}_n)\text{scale}_n + \text{minhysteresis}_n$$

$$\text{lowerhysteresis} = (\text{stepsize}L_n - \text{minstep}_n)\text{scale}_n + \text{minhysteresis}_n,$$

where $g_n$ is the gain of the $n^{th}$ gain stage.

20. An integrated circuit, comprising:
a circuit-supporting substrate; and
an electronic circuit disposed on the circuit-supporting substrate, the electronic circuit comprising:
a plurality of analog filters in an RF front-end section of an RF receiver;
a plurality of adjustable-gain analog amplifiers in the RF front-end section for amplifying by a gain a signal received by the RF receiver, each adjustable-gain analog amplifier operable at one gain separately selected from a plurality of gains, the RF front-end section producing an analog signal at an analog output;
a digital-to-analog converter, coupled to the analog output, for converting the analog signal to a digital signal at a digital output; and
a digital automatic gain control (AGC) system, communicatively coupled with the plurality of adjustable-gain analog amplifiers, for controlling the one gain of each adjustable-gain analog amplifier, the digital AGC system including:
a plurality of digital equalizer filters, one of the digital equalizer filters communicatively coupled with the digital output of the RF front-end section, thereby monitoring a digital signal estimate of the analog signal at the analog output of the RF front-end section, each digital equalizer filter having an inverse magnitude response of a corresponding analog filter in the RF front-end section;
a plurality of digital estimation devices, each digital estimation device coupled to one of the digital equalizer filters, each digital estimation device providing a digital signal estimate representative of an analog signal at an input of a respective one of the adjustable-gain analog amplifiers in the RF front-end section; and
an AGC controller, communicatively coupled with each digital estimation device, for monitoring the digital signal estimate provided by each digital estimation device, thereby monitoring a level of the analog signal at the input of the respective one of the adjustable-gain analog amplifiers in the RF front-end section, the AGC controller having a control output communicatively coupled with a respective control input of each adjustable-gain analog amplifier for separately controlling the one gain of each respective adjustable-gain analog amplifier.

* * * * *

UNITED STATES PATENT AND TRADEMARK OFFICE
CERTIFICATE OF CORRECTION

PATENT NO.       : 7,760,816 B2                                     Page 1 of 1
APPLICATION NO.  : 11/622402
DATED            : July 20, 2010
INVENTOR(S)      : Charles LeRoy Sobchak et al.

It is certified that error appears in the above-identified patent and that said Letters Patent is hereby corrected as shown below:

In line 7 of the ABSTRACT,

"line-up (10)" should be changed to --line-up (102)--.

In Col. 13, lines 22 and 23,

"plurality of one digital estimation device" should be changed to --plurality of digital estimation devices--.

Signed and Sealed this

Twenty-eighth Day of September, 2010

David J. Kappos
*Director of the United States Patent and Trademark Office*